(12) United States Patent
Sun et al.

(10) Patent No.: US 11,287,690 B2
(45) Date of Patent: Mar. 29, 2022

(54) DISPLAY PANEL AND DISPLAY DEVICE

(71) Applicant: Wuhan China Star Optoelectronics Technology Co., Ltd., Wuhan (CN)

(72) Inventors: Yuan Sun, Wuhan (CN); Chao Wang, Wuhan (CN); Guanghui Liu, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 312 days.

(21) Appl. No.: 16/620,171

(22) PCT Filed: Sep. 30, 2019

(86) PCT No.: PCT/CN2019/109396
§ 371 (c)(1),
(2) Date: Dec. 6, 2019

(87) PCT Pub. No.: WO2020/220578
PCT Pub. Date: Nov. 5, 2020

(65) Prior Publication Data
US 2021/0405447 A1   Dec. 30, 2021

(30) Foreign Application Priority Data

Apr. 29, 2019   (CN) .......................... 201910354492.7

(51) Int. Cl.
| | |
|---|---|
| *G09G 3/36* | (2006.01) |
| *G02F 1/13357* | (2006.01) |
| *H01L 27/32* | (2006.01) |
| *H04N 5/225* | (2006.01) |

(Continued)

(52) U.S. Cl.
CPC ..... *G02F 1/133603* (2013.01); *G09G 3/3426* (2013.01); *G09G 3/36* (2013.01); *H01L 27/3232* (2013.01); *H04N 5/2257* (2013.01); *G02F 2203/03* (2013.01); *H04M 1/0266* (2013.01)

(58) Field of Classification Search
CPC .......... G02F 1/133603; G02F 2203/03; G09G 3/3426; G09G 3/36; G09G 3/34; G09G 5/00; H01L 27/3232; H04M 1/0266; H04N 5/2257; G06F 3/038
See application file for complete search history.

(56) References Cited

U.S. PATENT DOCUMENTS

| | | | |
|---|---|---|---|
| 2013/0201176 A1* | 8/2013 | Lee ........................ | G06F 1/1601 345/214 |
| 2016/0197131 A1* | 7/2016 | Park .................. | G02F 1/133377 349/139 |

(Continued)

*Primary Examiner* — Pegeman Karimi (57) ABSTRACT

A display panel and a display device are provided. The display panel includes a display area including a transparent display area and an opaque display area surrounding the transparent display area. The display panel further includes a first substrate layer, a luminous layer, a liquid crystal layer, a first driving layer, and a second driving layer. The display panel is divided into the transparent display area and the opaque display area by combining an organic light-emitting diode technology and a liquid crystal display technology, such that the transparent display area can provide a light channel for a camera and can also display an image, thereby improving a screen-to-body ratio and realizing a real full-screen display.

10 Claims, 4 Drawing Sheets

(51) Int. Cl.
*G09G 3/34* (2006.01)
*H04M 1/02* (2006.01)

(56) References Cited

U.S. PATENT DOCUMENTS

2017/0062535 A1* 3/2017 Kim .................... H01L 27/3246
2018/0286930 A1* 10/2018 Gai .................... G02B 27/0172

* cited by examiner

DISPLAY PANEL AND DISPLAY DEVICE

FIELD OF DISCLOSURE

The present disclosure relates to the field of displays, and in particular to a display panel and a display device.

BACKGROUND

Smart terminals such as mobile phones and tablet computers are becoming an indispensable part of people's daily life due to their convenience, entertainment, and functional diversity. With the continuous development of display technology, applications of more advanced technologies on smart terminals have greatly enriched people's lives. At the same time, people's requirements and expectations for smart terminals are getting higher and higher. While enjoying basic functions brought by smart terminals such as mobile phones and tablet computers, people also put forward higher requirements for smart terminals, such as a full-screen design of smart terminals.

Full-screen technology is a broader definition of a mobile phone design for ultra-high screen-to-body ratio in a display industry. Literally, a front of the phone is occupied by the screen. A display interface of the mobile phone is completely covered by the screen, and four borders of the mobile phone are all designed with no borders, thereby achieving an ultra-high screen-to-body ratio of nearly 100%. However, it is limited by basic functions that are indispensable for mobile phones such as a front camera, an earpiece, a distance sensor, and a light sensor, so that at present, there is a notch in an upper part of the screen of the mobile display device to dispose the above functional components. The industry-recognized full-screen display is only a display device with an ultra-high screen-to-body ratio, rather than a display device with a screen-to-body ratio of 100%. This is so-called "bangs screen" or "water drop screen". This affects an overall attractive appearance of the terminal intelligent terminal. Alternatively, in the prior art, a basic functional component is placed by other mechanical structures, for example, by a structure such as a lifting camera to realize a full-screen display. However, the display device with the lifting camera has disadvantages of being non-waterproof, having a low lifespan, being easily damaged, and low quality user experience. Therefore, there is a need for a technical solution that can further reduce or eliminate an influence of the camera on the screen-to-body ratio and increase the screen-to-body ratio.

SUMMARY OF DISCLOSURE

An object of the present disclosure is to provide a display panel and a display device, which combine an organic light-emitting diode (OLED) and a liquid crystal display (LCD) to solve the problems that a screen-to-body ratio of a mobile display device in the prior art cannot reach 100%, a real full-screen cannot be realized, and an overall attractive appearance is not good.

To achieve the above object, the present disclosure provides a display panel including: a display area including a transparent display area and an opaque display area surrounding the transparent display area.

In the display area, the display panel further includes a first substrate layer, a luminous layer, a liquid crystal layer, a first driving layer, and a second driving layer. The luminous layer is disposed on the first substrate layer, where the luminous layer includes a first through hole, and the first through hole corresponds to the transparent display area. The liquid crystal layer is disposed on the luminous layer.

The first driving layer is disposed between the first substrate layer and the luminous layer. The second driving layer is disposed between the first substrate layer and the luminous layer, or is disposed on the liquid crystal layer. The first driving layer corresponds to the opaque display area, and is configured to provide a driving signal to the opaque display area. The second driving layer corresponds to the transparent display area, and is configured to provide a driving signal to the transparent display area.

Furthermore, the liquid crystal layer is filled with scattering liquid crystal.

Furthermore, the first driving layer includes an organic electroluminescent driving circuit.

Furthermore, the second driving layer is selected from a group consisting of an field-sequence driving circuit, an in-plane switching driving circuit, a vertical alignment liquid crystal driving circuit, and a twisted nematic liquid crystal driving circuit.

Furthermore, a plurality of organic electroluminescent devices are arranged on the luminous layer.

Furthermore, material of the second driving layer includes indium tin oxide.

Furthermore, the display panel further includes a second substrate layer and a sealant layer. The second substrate layer is disposed on the liquid crystal layer. The sealant layer is perpendicular to edges of the first substrate layer and the second substrate layer, and surrounding the first driving layer, the luminous layer, and the liquid crystal layer.

Furthermore, in response to the second driving layer disposed between the first substrate layer and the luminous layer, the first driving layer surrounds the second driving layer. In response to the second driving layer disposed on the liquid crystal layer, the first driving layer includes a second through hole, where the second through hole corresponds to the transparent display area.

The present disclosure also provides a display device including the display panel as described above.

Furthermore, the display device further includes a camera disposed on a surface of the display panel adjacent to the first substrate layer and corresponding to the transparent display area.

Advantages of the present disclosure are as follows. A display panel and a display device of the present disclosure combine an organic light-emitting diode technology and a liquid crystal display technology, and a display panel is divided into a transparent display area and an opaque display area. When a camera is turned on, the transparent display area is in a transparent state, which can provide a light channel for the camera. When the camera is turned off, the transparent display area can display an image normally, thereby improving a screen-to-body ratio, realizing a full-screen display, reducing an influence of the camera positioned under the screen and the like on the display panel, improving an overall attractive appearance of the display device, and enhancing quality of user experience.

BRIEF DESCRIPTION OF DRAWINGS

To illustrate the technical solutions according to the embodiments of the present disclosure more clearly, the accompanying drawings for describing the embodiments are introduced briefly in the following. Apparently, the accompanying drawings in the following description are only some embodiments of the present disclosure, and persons of ordinary skill in the art may derive other drawings from the accompanying drawings without creative efforts.

Reference numerals of components in the drawings are as follow.

display panel 100; display area 110;
transparent display area 111; opaque display area 112;
first substrate layer 10; second substrate layer 20;
sealant layer 30; luminous layer 40;
first through hole 41; liquid crystal layer 50;
first driving layer 60; second through hole 61;
second driving layer 70; camera 200;
display device 1000

DETAILED DESCRIPTION

Preferred embodiments of the present disclosure will be introduced with reference to appended drawings as follows to demonstrate that the present disclosure may be implemented. The embodiment of the present disclosure can be fully introduced to those skilled in the art to make technical contents more clear and easy to understand. The present disclosure can be embodied in many different forms of embodiment, and the scope of protection of the present disclosure is not limited to the embodiments set forth herein.

In the accompanying drawings, structurally identical components are designated by the same reference numerals, and structurally or functionally similar components throughout are designated by similar numerical reference numerals. The dimensions and thicknesses of each component shown in the drawings are arbitrarily shown. The size and thickness of each component are not limited, and for the sake of clarity, the thickness of the components is exaggerated somewhat in some places in the drawings.

Furthermore, the following descriptions of the various embodiments are made with reference to the accompanying drawings for illustrating, in an exemplary way, specific embodiments to which the present disclosure is applicable. Directional terminology, such as "up", "down", "front", "rear", "left", "right", "internal", "external", and "side", used in the present disclosure are described according to the direction shown in the drawings and are not intended to indicate or suggest a designated device or component must be of a specific direction or be constructed or operated in a specific direction and thus they should not be construed as constraint to the scope of the present disclosure. In addition, terms such as "first", "second", and "third" are used herein for purposes of description and are not intended to indicate or imply relative importance.

When a component is described to be "on" the other component, the component may be directly disposed on the other component; alternatively, an intervening component may exist, the component is disposed on the intervening component, and the intervening component is disposed on the other component. When a component is described to be "installed on" or "connected to" the other component, it may be understood that the component is directly "installed" or "connected" to each other, alternatively it is understood that one component is "installed" or "connected" to the other component through an intervening component.

First Embodiment

Figure 1:
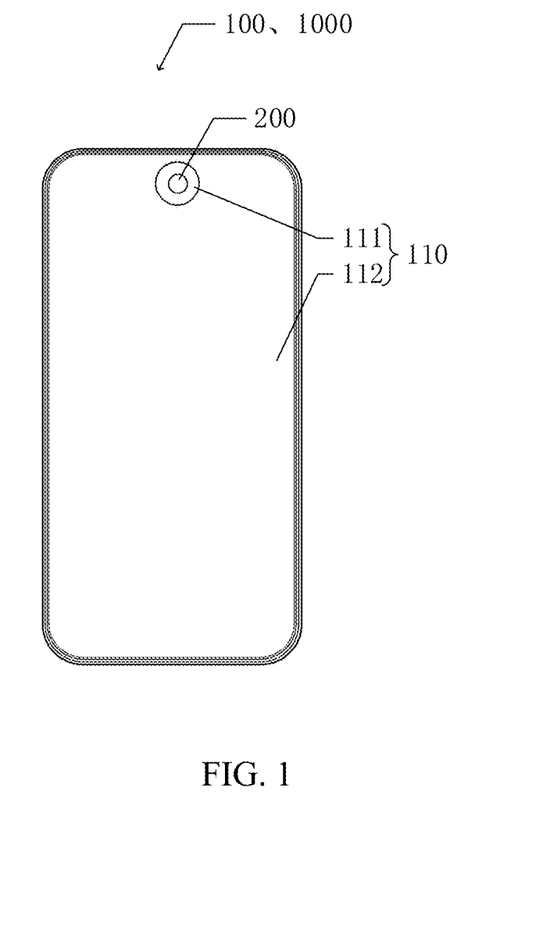
FIG. 1 is a main view of a display panel of a first embodiment or a second embodiment of the present disclosure.

As shown in FIG. 1, the embodiment of the present disclosure provides a display panel 100. The display panel 100 includes a display area 110, and the display area 110 includes a transparent display area 111 and an opaque display area 112. The opaque display area 112 surrounds the transparent display area 111.

Figure 2:
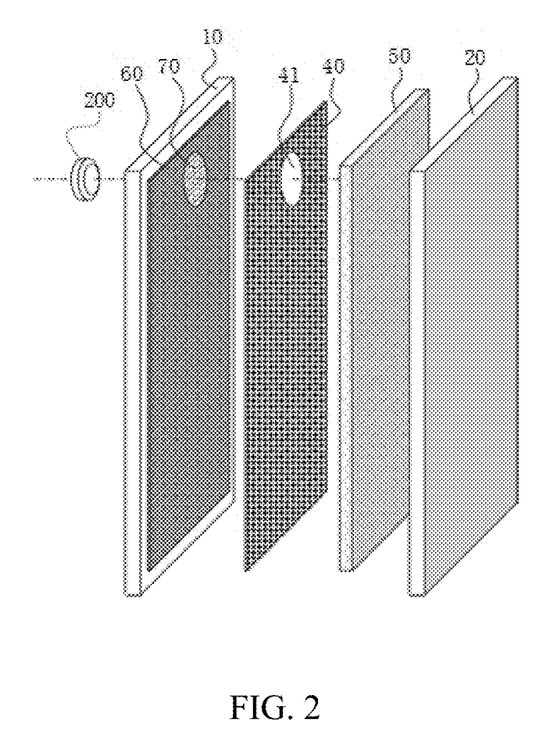
FIG. 2 is a schematic diagram of partial components of the display panel of the first embodiment of the present disclosure.

As shown in FIG. 2, in the display area 110, the display panel 100 further includes a first substrate layer 10, a luminous layer 40, a liquid crystal layer 50, a first driving layer 60, and a second driving layer 70.

The luminous layer 40 is disposed on the first substrate layer 10 and has a first through hole 41. The first through hole 41 corresponds to the transparent display area 111. The first through hole 41 is configured to provide a light channel for the camera 200. The luminous layer 40 is composed of a plurality of pixel units. The pixel units include a red pixel unit, a green pixel unit, and a blue pixel unit. The red pixel unit, the green pixel unit, and the blue pixel unit are sequentially arranged in an array to form the luminous layer 40. The colors between adjacent pixel units are different. The pixel unit is composed of an organic electroluminescent device of a corresponding color to emit a desired color light. The luminous layer 40 realizes displaying a color image through the plurality of pixel units. The opaque display area 112 of the display panel 100 realizes displaying an image through the luminous layer 40.

The liquid crystal layer 50 is disposed on the luminous layer 40. The liquid crystal layer 50 is filled with scattering liquid crystal. The scattering liquid crystal can cause disordered movement of liquid crystal molecules by external conditions such as an electric field, voltage, current, frequency, etc., so that the sequence and refractive index of the liquid crystal molecules in the liquid crystal layer 50 are changed, thereby scattering incident light entering the liquid crystal layer 50. The liquid crystal layer 50 realizes displaying an image in the transparent display area 111 by the scattering liquid crystal.

The first driving layer 60 is disposed between the first substrate layer 10 and the luminous layer 40. The first driving layer 60 corresponds to the opaque display area 112, which is an organic electroluminescent driving circuit. The first driving layer 60 is configured to provide a driving signal to the luminous layer 40, so as to control the opaque display area 112 to display an image.

The second driving layer 70 is disposed between the first substrate layer 10 and the luminous layer 40. The first driving layer 60 surrounds the second driving layer 70. The second driving layer 70 corresponds to the transparent display area 111. Material of the second driving layer 70 is indium tin oxide (ITO). In this embodiment of the present disclosure, the second driving layer 70 is a field-sequence driving circuit, and may also be one of driving circuits such as an in-plane switching driving circuit, a vertical alignment liquid crystal driving circuit, and a twisted nematic liquid crystal driving circuit. The second driving layer 70 is configured to provide a driving signal for the liquid crystal layer 50 and a portion of the organic electroluminescent device around the transparent display area 111 to control the transparent display area 111 to display an image. When it is required to achieve partial transparency, the second driving layer 70 drives the liquid crystal layer 50 to realize the transparent display area 111 being in a transparent state, and provide a light channel for the camera 200 and the like. When the device such as the camera 200 is turned off, the second driving layer 70 drives the liquid crystal layer 50 to display an image in the transparent display area 111.

In the prior art, the liquid crystal layer 50 needs to filter, convert, and analyze the light by a polarizer to display an image. However, the polarizer has a low light transmittance and cannot transmit external light. Therefore, in this embodiment of the present disclosure, the liquid crystal layer 50 omits the prior art polarizer, and the second driving layer 70 has a high aperture, so light can easily pass through the second driving layer 70 to enter a next layer structure.

Figure 3:
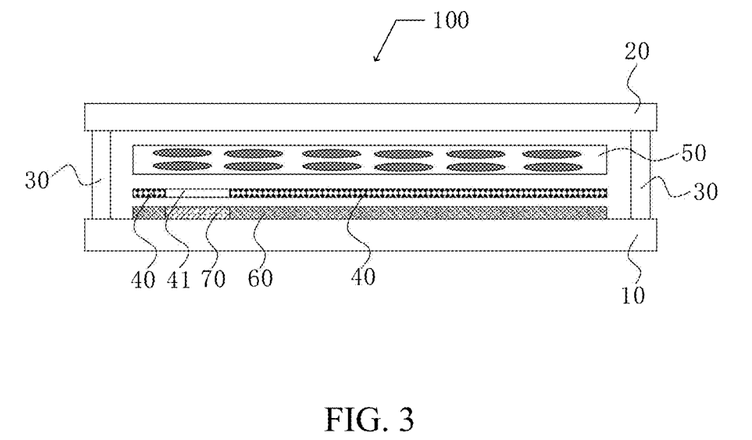
FIG. 3 is a schematic diagram of a layer structure of the display panel of the first embodiment of the present disclosure.

As shown in FIG. 3, the display panel 100 further includes a second substrate layer 20 and a sealant layer 30. The second substrate layer 20 is disposed on the liquid crystal layer 50. The sealant layer 30 is perpendicular to edges of the first substrate layer 10 and the second substrate layer 20, and surrounds the first driving layer 60, the luminous layer 40, and the liquid crystal layer 50. The first substrate layer 10, the second substrate layer 20, and the sealant layer 30 enclose a sealed chamber to protect the device in the display panel 100 in the chamber and to isolate the device from outside water and oxygen, thereby preventing a corrosion of each display device by water and oxygen, and increasing a lifespan of the display panel 100.

This embodiment of the present disclosure also provides a display device 1000, which includes the display panel 100 as described above and a camera 200. The camera 200 is disposed on a surface of the display panel 100 adjacent to the first substrate layer 10 and corresponds to the transparent display area 111. A size of the camera 200 can be adjusted according to a size of the transparent display area 111 to further optimize a space occupied by the camera 200. The display device 1000 realizes full-screen display, and may be any product or component having a display function such as a mobile phone, a tablet computer, a notebook computer, or the like.

The display panel 100 and the display device 1000 are provided in this embodiment of the present disclosure. The display panel 100 divides the display area 110 into the transparent display area 111 and the opaque display area 112. The opaque display area 112 is a conventional display area, and uses an organic electroluminescence display technology. The display technology used in the transparent display area 111 is a liquid crystal display technology. When the camera 200 is turned on, the transparent display area 111 is in a transparent state, so that the camera 200 can be provided with a light channel. When the camera 200 is turned off, the transparent display area 111 can display an image normally. The display panel 100 and the display device 1000 in this embodiment of the present disclosure combine an organic light-emitting diode technology and a liquid crystal display technology.

Dual functions of display and light transmission the transparent display area 111 corresponding to the camera 200 are implemented by using the liquid crystal display technology to eliminate an influence of the camera 200 on the display panel 100, such that a screen-to-body ratio of the display panel 100 can be 100%, thereby realizing a real full-screen display, improving the attractive appearance of the display device 1000, and enhancing quality of user experience.

Second Embodiment

As shown in FIG. 1, this embodiment of the present disclosure provides a display panel 100. The display panel 100 includes a display area 110, and the display area 110 includes a transparent display area 111 and an opaque display area 112. The opaque display area 112 surrounds the transparent display area 111.

Figure 4:
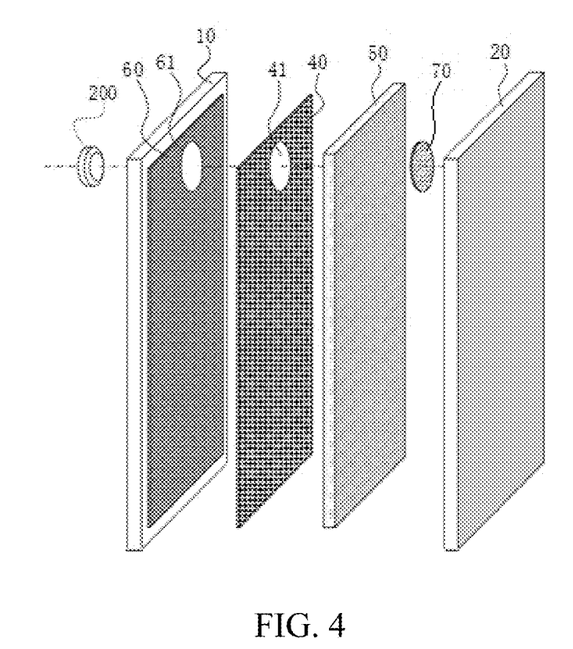
FIG. 4 is a schematic diagram of partial components of the display panel of the second embodiment of the present disclosure.

As shown in FIG. 4, in the display area 110, the display panel 100 further includes a first substrate layer 10, a luminous layer 40, a liquid crystal layer 50, a first driving layer 60, and a second driving layer 70.

The luminous layer 40 is disposed on the first substrate layer 10 and has a first through hole 41. The first through hole 41 corresponds to the transparent display area 111. The first through hole 41 is configured to provide a light channel for the camera 200. The luminous layer 40 is composed of a plurality of pixel units. The pixel units include a red pixel unit, a green pixel unit, and a blue pixel unit. The red pixel unit, the green pixel unit, and the blue pixel unit are sequentially arranged in an array to form the luminous layer 40. The colors between adjacent pixel units are different. The pixel unit is composed of an organic electroluminescent device of a corresponding color to emit a desired color light. The luminous layer 40 realizes displaying a color image through the plurality of pixel units. The opaque display area 112 of the display panel 100 realizes displaying an image through the luminous layer 40.

The liquid crystal layer 50 is disposed on the luminous layer 40. The liquid crystal layer 50 is filled with scattering liquid crystal. The scattering liquid crystal can cause disordered movement of liquid crystal molecules by external conditions such as an electric field, voltage, current, frequency, etc., so that the sequence and refractive index of the liquid crystal molecules in the liquid crystal layer 50 are changed, thereby scattering incident light entering the liquid crystal layer 50. The liquid crystal layer 50 realizes displaying an image in the transparent display area 111 by the scattering liquid crystal.

The first driving layer 60 is disposed between the first substrate layer 10 and the luminous layer 40, and is provides with a second through hole 61. The second through hole 61 corresponds to the transparent display area 111, which is an organic electroluminescent driving circuit. The first driving layer 60 is configured to provide a driving signal to the luminous layer 40, so as to control the opaque display area 112 to display an image.

The second driving layer 70 is disposed on a surface of the liquid crystal layer 50 away from the luminous layer 40, and the second driving layer 70 corresponds to the transparent display area 111. Material of the second driving layer 70 is indium tin oxide (ITO). In this embodiment of the present disclosure, the second driving layer 70 is a vertical alignment liquid crystal driving circuit, and may also be one of driving circuits such as a twisted nematic liquid crystal driving circuit, a field-sequence driving circuit, an in-plane switching driving circuit. The second driving layer 70 is configured to provide a driving signal for the liquid crystal layer 50 to control the transparent display area 111 to display an image. When it is required to achieve partial transparency, the second driving layer 70 drives the liquid crystal layer 50 to realize the transparent display area 111 being in a transparent state, and provide a light channel for the camera 200 and the like. When the device such as the camera 200 is turned off, the second driving layer 70 drives the liquid crystal layer 50 to display an image in the transparent display area 111.

In the prior art, the liquid crystal layer 50 needs to filter, convert, and analyze the light by a polarizer to display an image. However, the polarizer has a low light transmittance and cannot transmit external light. Therefore, in this embodiment of the present disclosure, the liquid crystal layer 50 omits the prior art polarizer, and the second driving layer 70 has a high aperture, so light can easily pass through the second driving layer 70 to enter a next layer structure.

Figure 5:
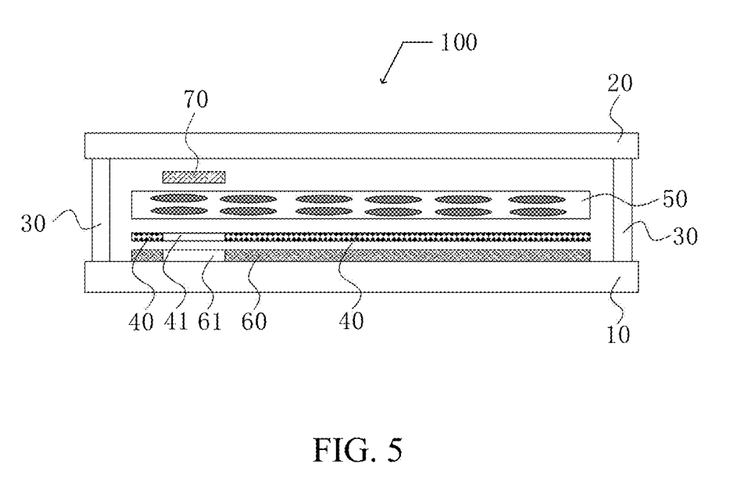
FIG. 5 is a schematic diagram of a layer structure of the display panel of the second embodiment of the present disclosure.

As shown in FIG. 5, the display panel 100 further includes a second substrate layer 20 and a sealant layer 30. The second substrate layer 20 is disposed on the liquid crystal layer 50. The sealant layer 30 is perpendicular to edges of the first substrate layer 10 and the second substrate layer 20, and surrounds the first driving layer 60, the luminous layer 40, and the liquid crystal layer 50. The first substrate layer 10, the second substrate layer 20, and the sealant layer 30 enclose a sealed chamber to protect the device of the display panel 100 in the chamber and to isolate the device from outside water and oxygen, thereby preventing a corrosion of each display device by water and oxygen, and increasing a lifespan of the display panel 100.

This embodiment of the present disclosure also provides a display device 1000, which includes the display panel 100 as described above and a camera 200. The camera 200 is disposed on a surface of the display panel 100 adjacent to the first substrate layer 10 and corresponds to the transparent display area 111. A size of the camera 200 can be adjusted according to a size of the transparent display area 111 to further optimize a space occupied by the camera 200. The display device 1000 realizes full-screen display, and may be any product or component having a display function such as a mobile phone, a tablet computer, a notebook computer, or the like.

The display panel 100 and the display device 1000 are provided in the embodiments of the present disclosure. The display area 110 of the display panel 100 is divided into the transparent display area 111 and the opaque display area 112. The opaque display area 112 is a conventional display area, and uses an organic electroluminescence display technology. The display technology used in the transparent display area 111 is a liquid crystal display technology. When the camera 200 is turned on, the transparent display area 111 is in a transparent state, so that the camera 200 can be provided with a light channel. When the camera 200 is turned off, the transparent display area 111 can display an image normally. The display panel 100 and the display device 1000 in the embodiments of the present disclosure combine an organic light-emitting diode technology and a liquid crystal display technology. Dual functions of display and light transmission in the transparent display area 111 corresponding to the camera 200 are implemented by using the liquid crystal display technology, so as to eliminate an influence of the camera 200 on the display panel 100, such that a screen-to-body ratio of the display panel 100 can be 100%, thereby realizing a real full-screen display, improving the attractive appearance of the display device 1000, and enhancing quality of user experience.

In this embodiment, the transparent display area 111 is a circular shape as shown in FIG. 1, however, in other embodiments of the present disclosure, the transparent display area 111 may also have other shapes such as a "u" shape, a square shape, a teardrop shape, and the like. The layer structure is similar to the display panel 100 and the display device 1000 in this embodiment, and is not described here again. All other embodiments obtained by a person of ordinary skill in the art based on the embodiments of the present application without departing from the inventive scope are within the scope of the present application.

The present disclosure has been described with reference to preferred embodiments, which are only embodiments for illustrating the principle and application of the present disclosure. It should be understood that various modifications and variants to the present disclosure may be made by anyone skilled in the art, without departing from the scope and spirit of the present disclosure. It should be noted that various dependent claims and technical features described herein may be combined with one another in any different manner from the original claims. It should also be understood that the technical features described in view of a single embodiment can also be applied to other embodiments.

What is claimed is:

1. A display panel, comprising: a display area comprising a transparent display area and an opaque display area surrounding the transparent display area, wherein in the display area, the display panel further comprises:
   a first substrate layer;
   a luminous layer disposed on the first substrate layer, wherein the luminous layer comprises a first through hole, and the first through hole corresponds to the transparent display area;
   a liquid crystal layer disposed on the luminous layer;
   a first driving layer disposed between the first substrate layer and the luminous layer; and
   a second driving layer disposed between the first substrate layer and the luminous layer, or disposed on the liquid crystal layer;
   wherein the first driving layer corresponds to the opaque display area, and is configured to provide a driving signal to the opaque display area; and
   wherein the second driving layer corresponds to the transparent display area, and is configured to provide a driving signal to the transparent display area.

2. The display panel as claimed in claim 1, wherein the liquid crystal layer is filled with scattering liquid crystal.

3. The display panel as claimed in claim 1, wherein the first driving layer comprises an organic electroluminescent driving circuit.

4. The display panel as claimed in claim 1, wherein the second driving layer is selected from a group consisting of an field-sequence driving circuit, an in-plane switching driving circuit, a vertical alignment liquid crystal driving circuit, and a twisted nematic liquid crystal driving circuit.

5. The display panel as claimed in claim 1, wherein a plurality of organic electroluminescent devices are arranged on the luminous layer.

6. The display panel as claimed in claim 1, wherein material of the second driving layer comprises indium tin oxide.

7. The display panel as claimed in claim 1, further comprising:
   a second substrate layer disposed on the liquid crystal layer; and
   a sealant layer perpendicular to edges of the first substrate layer and the second substrate layer, and surrounding the first driving layer, the luminous layer, and the liquid crystal layer.

8. The display panel as claimed in claim 1, wherein in response to the second driving layer disposed between the first substrate layer and the luminous layer, the first driving layer surrounds the second driving layer; and
   in response to the second driving layer disposed on the liquid crystal layer, the first driving layer comprises a second through hole, wherein the second through hole corresponds to the transparent display area.

9. A display device, comprising the display panel according to claim 1.

10. The display device as claimed in claim 9, further comprising a camera disposed on a surface of the display panel adjacent to the first substrate layer and corresponding to the transparent display area.

\* \* \* \* \*